(12) United States Patent
Kuretake

(10) Patent No.: US 10,689,571 B2
(45) Date of Patent: Jun. 23, 2020

(54) LIGHT-EMITTING CERAMIC AND WAVELENGTH CONVERSION DEVICE

(71) Applicant: Murata Manufacturing Co., Ltd., Nagaokakyo-shi, Kyoto-fu (JP)

(72) Inventor: Satoshi Kuretake, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 65 days.

(21) Appl. No.: 16/204,231

(22) Filed: Nov. 29, 2018

(65) Prior Publication Data

US 2019/0106622 A1 Apr. 11, 2019

Related U.S. Application Data

(63) Continuation of application No. PCT/JP2017/014945, filed on Apr. 12, 2017.

(30) Foreign Application Priority Data

Aug. 12, 2016 (JP) .................. 2016-158829

(51) Int. Cl.
*C09K 11/77* (2006.01)
*C04B 35/486* (2006.01)
(Continued)

(52) U.S. Cl.
CPC ........ *C09K 11/7769* (2013.01); *C04B 35/457* (2013.01); *C04B 35/486* (2013.01); *C09K 11/7701* (2013.01); *C09K 11/7703* (2013.01); *H01L 33/486* (2013.01); *H01L 33/502* (2013.01); *H01L 33/60* (2013.01); *C04B 2235/3224* (2013.01); *C04B 2235/3225* (2013.01); *C04B 2235/3227* (2013.01);
(Continued)

(58) Field of Classification Search
CPC ..... H01L 33/502; H01L 33/486; H01L 33/60; C09K 11/7769; C04B 35/457
USPC .......................................................... 257/98
See application file for complete search history.

(56) References Cited

U.S. PATENT DOCUMENTS 8,674,310 B2 3/2014 Kuretake et al.
9,202,995 B2 12/2015 Kuretake
(Continued)

FOREIGN PATENT DOCUMENTS

JP 2012001637 A 1/2012
WO 2011158580 A1 12/2011
(Continued)

OTHER PUBLICATIONS

International Search Report issued for PCT/JP2017/014945, dated May 30, 2017.
(Continued)

*Primary Examiner* — Igwe U Anya
(74) *Attorney, Agent, or Firm* — Arent Fox LLP

(57) ABSTRACT

A light-emitting ceramic that includes a pyrochlore type compound that contains 0.01 mol % or more of Bi with respect to 100 mol % of $ABO_W$, and one co-added element selected from the group consisting of Mg, Ca, Zn, Sr, Ba, Sc, Ga, In, Yb, and Lu. The A site contains at least one selected from the group consisting of La, Y, and Gd in a total amount of 80 mol % or more, B contains at least Sn, and W is a positive number for maintaining electrical neutrality.

20 Claims, 2 Drawing Sheets

(51) Int. Cl.
*C04B 35/457* (2006.01)
*H01L 33/48* (2010.01)
*H01L 33/50* (2010.01)
*H01L 33/60* (2010.01)

(52) U.S. Cl.
CPC ............... *C04B 2235/3244* (2013.01); *C04B 2235/3298* (2013.01); *C04B 2235/6567* (2013.01); *C04B 2235/6585* (2013.01); *C04B 2235/664* (2013.01); *C04B 2235/76* (2013.01); *C04B 2235/9653* (2013.01); *H01L 33/507* (2013.01)

(56) References Cited

U.S. PATENT DOCUMENTS

| | | | |
|---|---|---|---|
| 9,777,213 B2 | 10/2017 | Hong et al. | |
| 10,000,696 B2 | 6/2018 | Kuretake | |
| 2008/0102012 A1* | 5/2008 | Saito | C01B 33/20 |
| | | | 423/263 |
| 2013/0105697 A1* | 5/2013 | Kuretake | C04B 35/457 |
| | | | 250/361 R |
| 2014/0209954 A1* | 7/2014 | Kuretake | H01L 33/504 |
| | | | 257/98 |
| 2015/0291879 A1 | 10/2015 | Hong et al. | |
| 2015/0329775 A1* | 11/2015 | Kuretake | C04B 35/50 |
| | | | 313/503 |

FOREIGN PATENT DOCUMENTS

| | | |
|---|---|---|
| WO | 2013058065 A1 | 4/2013 |
| WO | 2014104143 A1 | 7/2014 |
| WO | 2014119416 A1 | 8/2014 |

OTHER PUBLICATIONS

Written Opinion of the International Searching Authority issued for PCT/JP2017/014945, dated May 30, 2017.

* cited by examiner

LIGHT-EMITTING CERAMIC AND WAVELENGTH CONVERSION DEVICE

CROSS REFERENCE TO RELATED APPLICATIONS

The present application is a continuation of International application No. PCT/JP2017/014945, filed Apr. 12, 2017, which claims priority to Japanese Patent Application No. 2016-158829, filed Aug. 12, 2016, the entire contents of each of which are incorporated herein by reference.

FIELD OF THE INVENTION

The present invention relates to a light-emitting ceramic and a wavelength conversion device including the light-emitting ceramic.

BACKGROUND OF THE INVENTION

Conventionally, there has been known a light-emitting ceramic that emits light having a wavelength different from that of irradiated light when irradiated with light. Patent Document 1 listed below describes a light-emitting ceramic obtained by heat-treating a ceramic mainly including a pyrochlore type compound represented by $ABO_W$ (where A contains at least one selected from the group consisting of La, Y, Gd, Yb, and Lu, B contains at least one selected from the group consisting of Zr, Sn, and Hf and Bi, and W is a positive number for maintaining electrical neutrality) in a reducing atmosphere.

Patent Document 1: WO2014/119416 A1

SUMMARY OF THE INVENTION

In various applications utilizing phosphors, phosphors having light-emitting peak wavelengths and/or emission spectrum shapes suitable for applications and purposes are used. Therefore, phosphors having various light-emitting peak wavelengths and/or emission spectrum shapes are required. In Patent Document 1, the light-emitting peak wavelength and the emission spectrum shape are changed by changing the combination and composition ratio of constituent elements of the light-emitting ceramic. However, when only the configuration described in Patent Document 1 has been used, it has been impossible to provide a wavelength conversion element having various light-emitting peak wavelengths in a wide range.

An object of the present invention is to provide a light-emitting ceramic capable of realizing various light-emitting peak wavelengths in a wide range, and a wavelength conversion device including the light-emitting ceramic.

A light-emitting ceramic according to a first invention of the present application includes a pyrochlore type compound that contains 0.01 mol % or more of Bi with respect to 100 mol % of $ABO_W$ (where A contains at least one selected from the group consisting of La, Y, and Gd in a total amount of 80 mol % or more, B contains at least Sn, and W is a positive number for maintaining electrical neutrality. The light-emitting ceramic according to the first invention further contains at least one co-added element selected from the group consisting of Mg, Ca, Zn, Sr, Ba, Sc, Ga, In, Yb, and Lu.

A light-emitting ceramic according to a second invention of the present application includes a pyrochlore type compound that contains 0.01 mol % or more of Bi with respect to 100 mol % of $ABO_W$ (where A contains at least one selected from the group consisting of La, Y, and Gd, a total amount of the La, Y, and Gd is 80 mol % or more, and a total amount of the La is at least 50 mol % or more, B contains at least Zr or Hf, and W is a positive number for maintaining electrical neutrality. The light-emitting ceramic according to the second invention further contains at least one co-added element selected from the group consisting of Mg, Ca, Zn, Sr, Ba, Sc, Ga, In, Yb, and Lu.

Hereinafter, the present invention will be used when collectively referring to the first and second inventions.

In another specific aspect of the light-emitting ceramic according to the present invention, a total content of the at least one co-added element is 0.1 mol % or more. In this case, the light-emitting peak wavelength can be further largely shifted.

In the present specification, unless otherwise specified, the content (mol %) of the element is a ratio with respect to 100 mol % of $ABO_W$.

In another specific aspect of the light-emitting ceramic according to the present invention, a content of at the least one co-added element is not less than the content of Bi. In this case, the light-emitting peak wavelength can be further largely shifted.

In another specific aspect of the light-emitting ceramic according to the present invention, a content of the at least one co-added element is less than 20 mol %. In this case, light transmissive properties can be effectively improved. More preferably, the content of the at least one co-added element is 10 mol % or less.

In another specific aspect of the light-emitting ceramic according to the present invention, A contains any of Mg, Ca, Zn, Sr, and Ba, or B contains any of Sc, Ga, In, Yb, and Lu.

In still another specific aspect of the light-emitting ceramic according to the present invention, since the at least one co-added element selected from the group consisting of Mg, Ca, Zn, Sr, Ba, Sc, Ga, In, Yb, and Lu is contained in the light-emitting ceramic, a light-emitting peak wavelength in a visible region when irradiated with ultraviolet rays differs by 10 nm or more from the light-emitting peak wavelength of the same light-emitting ceramic except that does not contain the at least one selected from the group consisting of Mg, Ca, Zn, Sr, Ba, Sc, Ga, In, Yb, and Lu.

The wavelength conversion device according to the present invention includes a light-emitting ceramic configured according to the present invention and a light source that irradiates the light-emitting ceramic with ultraviolet rays.

It is to be noted that the term "light-emitting ceramic" used in the present application means a ceramic which absorbs at least a part of energy of light when irradiated with light such as ultraviolet rays and emits the absorbed energy as light of a wavelength different from the wavelength of the irradiated light.

According to the present invention, it is possible to provide a light-emitting ceramic capable of realizing more various light-emitting peak wavelengths and a wavelength conversion device.

DETAILED DESCRIPTION OF PREFERRED EMBODIMENTS OF THE INVENTION

Figure 1:
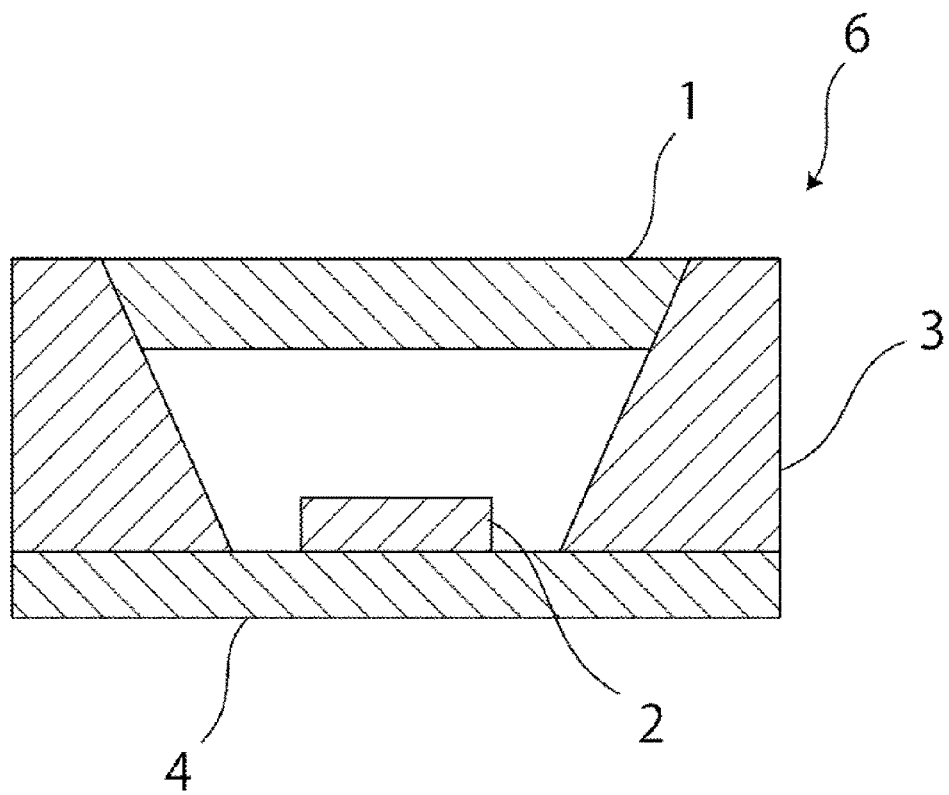
FIG. 1 is a schematic configuration diagram for explaining a wavelength conversion device as an embodiment of the present invention.

Hereinafter, the present invention will be clarified by explaining specific embodiments of the present invention with reference to the drawings.

It is to be noted that the embodiments described herein are illustrative and that partial replacement or combination of configurations is possible between different embodiments.

Hereinafter, the present invention will be described in detail.

(Light-Emitting Ceramic According to First Invention)

The light-emitting ceramic according to the first invention of the present application includes a pyrochlore type compound that contains 0.01 mol % or more of Bi with respect to 100 mol % of $ABO_W$ (where A contains at least one selected from the group consisting of La, Y, and Gd and contains at least one selected from the group consisting of La, Y, and Gd in a total amount of 80 mol % or more, B contains at least one selected from the group consisting of Zr, Sn, and Hf, and W is a positive number for maintaining electrical neutrality), where B contains at least Sn. The light-emitting ceramic according to the first invention further contains at least one selected from the group consisting of Mg, Ca, Zn, Sr, Ba, Sc, Ga, In, Yb, and Lu.

(Light-Emitting Ceramic According to Second Invention)

The light-emitting ceramic according to the second invention of the present application includes a pyrochlore type compound that contains 0.01 mol % or more of Bi with respect to 100 mol % of $ABO_W$ (where A contains at least one selected from the group consisting of La, Y, and Gd and contains at least one selected from the group consisting of La, Y, and Gd in a total amount of 80 mol % or more, B contains at least one selected from the group consisting of Zr, Sn, and Hf, and W is a positive number for maintaining electrical neutrality), where B contains at least Zr or Hf. The light-emitting ceramic according to the second invention further contains at least one selected from the group consisting of Mg, Ca, Zn, Sr, Ba, Sc, Ga, In, Yb, and Lu. Further, A contains at least 50 mol % or more of La.

(Details of Light-Emitting Ceramic of Present Invention)

The light-emitting ceramics according to the first and second inventions of the present application can be obtained by firing ceramic materials having the above composition ratio and then heat-treating the fired product in a reducing atmosphere. Since the light-emitting ceramic of the present invention is a ceramic, it is easier to manufacture than luminescent materials of single crystals. In the above firing, the ceramic materials may be fired in the form of powder, or may be fired after being once formed into a predetermined shape. In both cases, the light-emitting ceramic can be obtained by heat treatment in a reducing atmosphere. The light-emitting ceramic may be in the form of powder or may be dispersed in a resin or glass. The light-emitting ceramic, either in the form of powder or dispersed in a resin or glass, can be used as a material for producing an element having a wavelength conversion function. In $ABO_W$ above, W is a positive number for maintaining electrical neutrality. For example, when W is 3.5, specific examples of $ABO_W$ include A2 and B2O7.

The light-emitting ceramic $ABO_W$ of the present invention includes a pyrochlore type compound.

The pyrochlore structure is a superlattice structure having a defect fluorite type structure, and thus the ceramic $ABO_W$ sometimes takes an intermediate structure between both structures. In the present invention, the ceramic $ABO_W$ is defined as the pyrochlore type compound as long as the peak of (311) or (331), which is a superlattice peak in X-ray diffraction, can be seen.

In the present invention, at least one element selected from the group consisting of Mg, Ca, Zn, Sr, Ba, Sc, Ga, In, Yb, and Lu is contained in the light-emitting ceramic, and at least one element is added together with Bi. The at least one element is co-added, and a part of at least one selected from the group consisting of La, Y, and Gd at the A site or a part of at least one selected from the group consisting of Zr, Sn, and Hf at the B site is substituted for the at least one element.

Regarding Bi, a part of at least one selected from the group consisting of Zr, Sn, and Hf is substituted for Bi at the B site.

In the present invention, the A site (100 mol %) contains at least one element selected from the group consisting of La, Y, and Gd in a total amount of 80 mol % or more. This makes it possible to easily obtain a light-emitting ceramic having various light-emitting peak wavelengths.

As described in Patent Document 1, it is preferable that the B site contains Bi in a range of 0.001 mol % to 5 mol %. Thereby, the quantum yield of light emission can be effectively increased. The content is more preferably in a range of 0.01 mol % to 3 mol %, and more preferably 0.05 mol % or more and 1 mol % or less. Further, in the light-emitting ceramic according to the present invention, the light transmittance is preferably 50% or more, more preferably 60% or more, and still more preferably 70% or more in a visible range, i.e., in a wavelength range of 450 nm to 800 nm.

Bi is contained in a ratio of 0.01 mol % or more with respect to 100 mol % of $ABO_W$. Thereby, the light-emitting ceramic having various light-emitting peak wavelengths can be easily obtained.

In the light-emitting ceramic according to the present invention, at least one element selected from the group consisting of Mg, Ca, Zn, Sr, Ba, Sc, Ga, In, Yb, and Lu is added together with Bi, and the element co-added with Bi may be substituted for the A site or may be substituted for the B site. In either case, the light-emitting peak wavelength is largely shifted by the co-addition so that it is possible to provide the light-emitting ceramic having various light-emitting peak wavelengths.

A total content of at least one element selected from the group consisting of Mg, Ca, Zn, Sr, Ba, Sc, Ga, In, Yb, and Lu (i.e., the co-added amount) is preferably 0.1 mol % or more, so that it is possible to more easily provide the light-emitting ceramic having various light-emitting peak wavelengths.

Preferably, the content of at least one element selected from the group consisting of Mg, Ca, Zn, Sr, Ba, Sc, Ga, In, Yb, and Lu is not less than the content of Bi. In that case, the above-described wavelength shift occurs more reliably so that it is possible to provide a light-emitting ceramic having more various light-emitting peak wavelengths.

When the additive amount of at least one element selected from the group consisting of Mg, Ca, Zn, Sr, Ba, Sc, Ga, In, Yb, and Lu is too small, the light-emitting peak wavelength is hardly shifted. Here, the shift of the light-emitting peak wavelength means that the wavelength is shifted in the case where a light-emitting peak wavelength in a visible region, when irradiated with ultraviolet rays, differs by 10 nm or more from the light-emitting peak wavelength of the light-emitting ceramic having the same composition except that at least one element selected from the group consisting of Mg, Ca, Zn, Sr, Ba, Sc, Ga, In, Yb, and Lu is not added.

Therefore, in the present invention, it is possible to provide the light-emitting ceramic having various light-emitting peak wavelengths by co-adding at least one element selected from the group consisting of Mg, Ca, Zn, Sr, Ba, Sc, Ga, In, Yb, and Lu.

The content of at least one element selected from the group consisting of Mg, Ca, Zn, Sr, Ba, Sc, Ga, In, Yb, and Lu is preferably less than 20 mol %, and more preferably 10 mol % or less with respect to 100 mol % of A or 100 mol % of B. In this case, a light-emitting ceramic having excellent light transmittance can be obtained.

Further, it is preferable that the A site does not contain Bi.

(Method of Manufacturing Light-Emitting Ceramic)

The light-emitting ceramic is obtained by firing a ceramic having the composition of $ABO_W$ and heat-treating the fired ceramic in a reducing atmosphere. The reason why the light-emitting ceramic can be obtained by the heat treatment in the reducing atmosphere is considered as follows.

That is, as shown in Patent Document 1, in the ceramic $ABO_W$ produced by firing, it is believed that Bi exists in a pentavalent state. Thus, is believed that when the ceramic $ABO_W$ is heat-treated in a reducing atmosphere, electrons are supplied to Bi from the oxygen site before reduction, whereby Bi changes from a pentavalent state to a trivalent state. It is believed that the formation of the trivalent Bi causes the ceramic to emit light. In other words, it is believed that the electrons in the 6s2 orbital (i.e., the outermost electron orbital of trivalent Bi) transit to the 6s6p orbital with higher energy by the irradiation with excitation light, and then the light is emitted when being deactivated to the original 6s2 original.

The method of manufacturing the light-emitting ceramic of the present invention will be specifically described below.

First, a ceramic raw material powder is formed into a predetermined shape to form an unfired ceramic molded body. Next, the unfired ceramic molded body is fired in an atmosphere containing oxygen to produce a ceramic $ABO_W$. It is preferable that the firing atmosphere of the ceramic $ABO_W$ has an oxygen concentration of 98 vol % or more. The firing temperature (maximum temperature) can be, for example, about 1500° C. or more and about 1800° C. or less. The holding time of the firing temperature (maximum temperature) in the firing step can be, for example, about 5 hours or more and about 100 hours or less.

Subsequently, the obtained ceramic $ABO_W$ is subjected to heat treatment (reduction heat treatment) in a reducing atmosphere to produce a light-emitting ceramic. The reducing atmosphere for heat-treating the ceramic $ABO_W$ may be, for example, an $H_2/H_2O$ atmosphere. The heat treatment temperature (maximum temperature) of the ceramic $ABO_W$ is preferably, for example, 800° C. or more and 1200° C. or less, and more preferably 900° C. or more and 1100° C. or less. Further, the holding time of the heat treatment temperature (maximum temperature) of the ceramic $ABO_W$ can be, for example, about 1 hour or more and about 100 hours or less.

It is to be noted that the light transmittance of the ceramic $ABO_W$ at a wavelength of 400 nm or more and 600 nm or less is improved by the above heat treatment. This is because holes generated when firing the ceramic $ABO_W$ serve as color centers and absorb light of short wavelengths (such as wavelengths of 400 nm or more and 600 nm or less), and as a result of the reduction annealing, electrons are supplied from the oxygen site before reduction, and the holes serving as the color centers are neutralized.

It is to be noted that, as described above, the light-emitting ceramic according to the present invention is represented by $ABO_W$, but the molar ratio (A/B) between A and B is not strictly limited to 1:1. In the present invention, the light-emitting ceramic $ABO_W$ also includes those in which the molar ratio (A/B) between A and B is 0.95 or more and 1.05 or less.

The crystal system of the main component of the light-emitting ceramic according to the present invention may be cubic.

Further, although the light-emitting ceramic is represented by $ABO_W$, the light-emitting ceramic may contain impurities that are unavoidably mixed therein (hereinafter, referred to as "unavoidable impurities"), in addition to the A, B, and O components. Specific examples of the unavoidable impurities include $SiO_2$, $B_2O_3$, and $Al_2O_3$.

Embodiment of Wavelength Conversion Device

FIG. 1 is a schematic configuration diagram showing a wavelength conversion device as an embodiment of the present invention.

A wavelength conversion device 6 includes a wavelength converter 1 and a light source 2. The wavelength converter 1 is made of the light-emitting ceramic of the present invention. The light source 2 is provided on a substrate 4. A reflector 3 is disposed on the substrate 4 so as to surround the periphery of the light source 2 and surround the optical axis of the light emitted from the light source 2. The wavelength converter 1 is fixed to the light emitting side end of the reflector 3 and is opposed to the light source 2 at a position separated from the light source 2. For example, an LED or the like can be used as the light source 2.

When being driven, excitation light is emitted from the light source 2 toward the wavelength converter 1. A part of the excitation light is reflected by the reflector 3 and reaches the wavelength converter 1. The wavelength converter 1 is excited by the excitation light and emits light.

It is to be noted that although the wavelength conversion device 6 has been described, the wavelength conversion device of the present invention is not limited to the wavelength conversion device 6 shown in FIG. 1, and it is possible to provide various forms of wavelength conversion devices including a wavelength converter made of the light-emitting ceramic of the present invention and a light source for emitting light to the light-emitting ceramic.

EXAMPLES AND COMPARATIVE EXAMPLES

Subsequently, the present invention will be explained in more detail by describing examples and comparative examples of light-emitting ceramics of the present invention. It is to be noted that the present invention is not limited to the following examples.

Example 1

As raw materials, La(OH)3, Gd2O3, Y2O3, ZrO2, HfO2, SnO2, MgCO3, CaCO3, ZnO2, SrCO3, BaCO3, Sc2O3, Ga2O3, In2O3, Yb2O3, Lu2O3, and Bi2O3 were provided. These raw materials were weighed so as to have the composition ratios represented by the molar ratios in the following Table 1 and wet-mixed for 20 hours using a ball mill. The resulting mixture was dried and then calcined at 1300° C. for 3 hours to obtain a calcined product.

The calcined product was placed in a ball mill together with water and an organic dispersant and wet-pulverized for 12 hours. The resulting pulverized product was formed into a disk shape having a diameter of 30 mm and a thickness of 5 mm by a wet molding method. The resulting disc-shaped molded product was embedded in a powder of identical composition and fired at a temperature of 1700° C. for 20 hours in an oxygen atmosphere with an oxygen concentration of about 98 vol % to obtain a sintered body. Both surfaces of the resulting sintered body were mirror-polished so as to be a substrate having a thickness of 0.5 mm. Thereafter, the substrate was cut into a semicircular shape having a size of one-half. The cut substrate was heat-treated in a reducing atmosphere of N2/H2/H2O mixed gas having an oxygen partial pressure of $1.7 \times 10^{-13}$ MPa to obtain an evaluation sample. The maximum temperature for the heat treatment was 1000° C., and the holding time at 1000° C. was 3 hours.

Evaluation samples of composition Nos. 1 to 11 shown in Tables 1 and 2 below were obtained in the manner described above.

The evaluation samples obtained in the above-described manner were irradiated with ultraviolet rays having a wavelength of 365 nm using FluoroMax-4P (manufactured by HORIBA Jobin Yvon GmbH), and the emission spectra at that time were measured. Tables 1 and 2 show the light-emitting peak wavelengths of the obtained emission spectra. It is to be noted that, in each of the tables, the error in wavelength is about 5 nm. Since each of the evaluation samples had transparency, the linear transmittance in the visible light region was measured using an ultraviolet visible light spectrophotometer (UV-2500PC, manufactured by Shimadzu Corporation.), and the linear transmittance values at 700 nm were shown in Tables 1 and 2.

It is to be noted that the feed composition ratios in Tables 1 and 2 are molar ratios.

TABLE 1

| Comp. No. | Feed composition ratio (molar ratio) | | | | | | | | Light-emitting peak wavelength (nm) * During irradiation at 365 nm | Linear transmittance (%) @700 nm |
|---|---|---|---|---|---|---|---|---|---|---|
| | A | | | | | | B | | | |
| | La | Mg | Ca | Zn | Sr | Ba | Sn | Bi | | |
| 1 | 1 | | | | | | 0.999 | 0.001 | 700 | 72.6 |
| 2 | 0.99 | 0.01 | | | | | 0.999 | 0.001 | 575 | 72.4 |
| 3 | 0.99 | | 0.01 | | | | 0.999 | 0.001 | 575 | 70.5 |
| 4 | 0.99 | | | 0.01 | | | 0.999 | 0.001 | 575 | 70.8 |
| 5 | 0.99 | | | | 0.01 | | 0.999 | 0.001 | 570 | 72.6 |
| 6 | 0.99 | | | | | 0.01 | 0.999 | 0.001 | 575 | 71.8 |

TABLE 2

| Comp. No. | Feed composition ratio (molar ratio) | | | | | | | | Light-emitting peak wavelength (nm) * During irradiation at 365 nm | Linear transmittance (%) @700 nm |
|---|---|---|---|---|---|---|---|---|---|---|
| | A | B | | | | | | | | |
| | La | Sn | Sc | Ga | In | Yb | Lu | Bi | | |
| 1 | 1 | 0.999 | | | | | | 0.001 | 700 | 72.6 |
| 7 | 1 | 0.989 | 0.01 | | | | | 0.001 | 550 | 72.5 |
| 8 | 1 | 0.989 | | 0.01 | | | | 0.001 | 550 | 73.1 |
| 9 | 1 | 0.989 | | | 0.01 | | | 0.001 | 550 | 73.1 |
| 10 | 1 | 0.989 | | | | 0.01 | | 0.001 | 500 | 72.6 |
| 11 | 1 | 0.989 | | | | | 0.01 | 0.001 | 565 | 72.9 |

Tables 1 and 2 show that at least one element selected from the group consisting of Mg, Ca, Zn, Sr, Ba, Sc, Ga, In, Yb, and Lu is added to the A site so that the light-emitting peak wavelength can be largely changed compared to composition No. 1 (i.e., comparative example). It is found that, for example, in composition No. 2, since the content ratio of Mg is 1 mol %, the light-emitting peak wavelength is largely shifted from 700 nm of composition No. 1 to 575 nm. Further, as is apparent from Tables 1 and 2, it is found that even when at least one element selected from the group consisting of Mg, Ca, Zn, Sr, Ba, Sc, Ga, In, Yb, and Lu is contained in either the A site or the B site, the wavelength is sufficiently shifted. Furthermore, it is found that the linear transmittance is sufficiently as high as 70% or more.

Example 2

Evaluation samples of composition Nos. 12 to 24 shown in Tables 3, 4 and 5 below were obtained in the same manner as in Example 1. The light-emitting peak wavelength and linear transmittance of each of the obtained evaluation samples were determined in the same manner as in Example 1. The results are shown in Tables 3, 4, and 5. It is to be noted that the feed composition ratios in Tables 3, 4, and 5 are molar ratios.

TABLE 3

| Comp. No. | Feed composition ratio (molar ratio) | | | | Light-emitting peak wavelength (nm) * During irradiation at 365 nm | Linear transmittance (%) @700 nm |
|---|---|---|---|---|---|---|
| | A | | B | | | |
| | La | Ca | Sn | Bi | | |
| 1 | 1 | | 0.999 | 0.001 | 700 | 72.6 |
| 12 | 0.9995 | 0.0005 | 0.999 | 0.001 | 700 | 72.7 |
| 13 | 0.999 | 0.001 | 0.999 | 0.001 | 685 | 72.2 |
| 14 | 0.998 | 0.002 | 0.999 | 0.001 | 600 | 71.9 |
| 15 | 0.995 | 0.005 | 0.999 | 0.001 | 575 | 73.1 |
| 16 | 0.99 | 0.01 | 0.999 | 0.001 | 575 | 70.5 |
| 17 | 0.98 | 0.02 | 0.999 | 0.001 | 570 | 68.4 |
| 18 | 0.95 | 0.05 | 0.999 | 0.001 | 570 | 67.3 |
| 19 | 0.9 | 0.1 | 0.999 | 0.001 | 570 | 62.1 |
| 20 | 0.8 | 0.2 | 0.999 | 0.001 | 570 | 46.5 |

TABLE 4

| Comp. No. | Feed composition ratio (molar ratio) | | | | Light-emitting peak wavelength (nm) * During irradiation at 365 nm | Linear transmittance (%) @700 nm |
|---|---|---|---|---|---|---|
| | A | | B | | | |
| | La | Ca | Sn | Bi | | |
| 1 | 1 | | 0.999 | 0.001 | 700 | 72.6 |
| 12 | 0.9995 | 0.0005 | 0.999 | 0.001 | 700 | 72.7 |
| 21 | 0.9995 | 0.0005 | 0.9999 | 0.0001 | 570 | 72.4 |

TABLE 5

| Comp. No. | Feed composition ratio (molar ratio) | | | | Light-emitting peak wavelength (nm) * During irradiation at 365 nm | Linear transmittance (%) @700 nm |
|---|---|---|---|---|---|---|
| | A | | B | | | |
| | La | Ca | Sn | Bi | | |
| 1 | 1 | | 0.999 | 0.001 | 700 | 72.6 |
| 21 | 0.9995 | 0.0005 | 0.9999 | 0.0001 | 570 | 72.4 |
| 22 | 0.95 | 0.05 | 0.99 | 0.01 | 570 | 69.4 |
| 23 | 0.95 | 0.05 | 0.97 | 0.03 | 570 | 68.1 |
| 24 | 0.95 | 0.05 | 0.95 | 0.05 | 600 | 63.8 |

As is apparent from Table 3, it is found that when Ca as at least one element selected from the group consisting of Mg, Ca, Zn, Sr, Ba, Sc, Ga, In, Yb, and Lu is contained in the A site, the wavelength is not shifted in the case of composition No. 12. That is, when the additive amount of Ca as at least one element selected from the group consisting of Mg, Ca, Zn, Sr, Ba, Sc, Ga, In, Yb and Lu is 0.05 mol % or less with respect to the A site, the wavelength is not shifted.

On the other hand, when the additive amount of Ca as at least one element selected from the group consisting of Mg, Ca, Zn, Sr, Ba, Sc, Ga, In, Yb, and Lu is 0.1 mol % or more with respect to the A site, the wavelength is shifted. Therefore, it is possible to provide the light-emitting ceramic having various light-emitting peak wavelengths.

It is to be noted that, in composition No. 20, the content of Ca in the A site is 20 mol %, and in this case, the wavelength is shifted, but the linear transmittance is as low as less than 50%. However, in composition Nos. 17 to 19, the content of Ca in the A site is 10 mol % or less, and in this case, the linear transmittance can be increased to 60% or more while the wavelength is shifted. Further, in composition Nos. 13 to 16, the content of Ca in the A site is 1 mol % or less, and in this case, the linear transmittance can be increased to 70% or more while the wavelength is shifted. Therefore, it is desirable that the additive amount of Ca as at least one element selected from the group consisting of Mg, Ca, Zn, Sr, Ba, Sc, Ga, In, Yb, and Lu in the A site is preferably 0.1 mol % or more and less than 20 mol %. It is desirable that the additive amount of Ca is more preferably 10 mol % or less. It is desirable that the additive amount of Ca is still more preferably 1 mol % or less.

As is apparent from the comparison between composition No. 12 and composition No. 21 in Table 4, even if 0.05 mol % of Ca as at least one element selected from the group consisting of Mg, Ca, Zn, Sr, Ba, Sc, Ga, In, Yb, and Lu is contained in the A site, the wavelength is not shifted in the case of the composition No. 12 in which the content is smaller than the content of Bi. On the other hand, in composition No. 21, since the additive amount of Ca is larger than the additive amount of Bi, the wavelength is shifted. Therefore, it is desirable that the content in the site containing at least one element selected from the group consisting of Mg, Ca, Zn, Sr, Ba, Sc, Ga, In, Yb, and Lu is preferably larger than the content of Bi in the B site.

Further, from composition Nos. 21 to 24 in Table 5, it is found that even if the content of Bi is changed, when the content in the site containing at least one element selected from the group consisting of Mg, Ca, Zn, Sr, Ba, Sc, Ga, In, Yb, and Lu is not less than the content of Bi in the B site, the wavelength is shifted.

Therefore, in order to cause a wavelength shift and obtain the light-emitting ceramic having various light-emitting peak wavelengths, it is desirable that the content in the A site containing at least one element selected from the group consisting of Mg, Ca, Zn, Sr, Ba, Sc, Ga, In, Yb, and Lu is 0.1 mol % or more, or is not less than the content of Bi in the B site. From the viewpoint of the light transmittance, it is desirable that the content in the A site containing at least one element selected from the group consisting of Mg, Ca, Zn, Sr, Ba, Sc, Ga, In, Yb, and Lu is preferably less than 20 mol %, and more preferably 10 mol % or less.

Example 3

Evaluation samples of composition Nos. 25 to 34 shown in Table 6 below were obtained in the same manner as in Example 1. The light-emitting peak wavelength and linear transmittance of each of the evaluation samples were determined in the same manner as in Example 1. It is to be noted that Table 6 shows the results of composition Nos. 1 and 7.

TABLE 6

| Composition No. | Feed composition ratio (molar ratio) | | | | | | Light-emitting peak wavelength (nm) * During irradiation at 365 nm | Linear transmittance (%) @700 nm |
| --- | --- | --- | --- | --- | --- | --- | --- | --- |
| | A | | | B | | | | |
| | La | Gd | Y | Sn | Sc | Bi | | |
| 1 | 1 | | | 0.999 | | 0.001 | 700 | 72.6 |
| 7 | 1 | | | 0.989 | 0.01 | 0.001 | 550 | 72.5 |
| 25 | | 1 | | 0.999 | | 0.001 | 620 | 68.9 |
| 26 | | 1 | | 0.989 | 0.01 | 0.001 | 560 | 71.2 |
| 27 | | | 1 | 0.999 | | 0.001 | 600 | 69.4 |
| 28 | | | 1 | 0.989 | 0.01 | 0.001 | 565 | 68.7 |
| 29 | 0.5 | 0.5 | | 0.999 | | 0.001 | 635 | 68.9 |
| 30 | 0.5 | 0.5 | | 0.989 | 0.01 | 0.001 | 560 | 64.4 |
| 31 | 0.5 | | 0.5 | 0.999 | | 0.001 | 630 | 65.8 |
| 32 | 0.5 | | 0.5 | 0.989 | 0.01 | 0.001 | 560 | 68.7 |
| 33 | | 0.5 | 0.5 | 0.999 | | 0.001 | 620 | 67.0 |
| 34 | | 0.5 | 0.5 | 0.989 | 0.01 | 0.001 | 560 | 66.6 |

As is apparent from Table 6, it is found that as long as the B site contains Sn, the wavelength shift effect can be obtained even if the A site contains any of La, Gd, and Y.

Example 4

Evaluation samples of composition Nos. 35 to 62 shown in Tables 7 to 11 below were obtained in the same manner as in Example 1. The light-emitting peak wavelength and linear transmittance were determined in the same manner as in Example 1. The results are also shown in Tables 7 to 11.

TABLE 7

| Comp. No. | Feed composition ratio (molar ratio) | | | | | | | | Light-emitting peak wavelength (nm) * During irradiation at 365 nm | Linear transmittance (%) @700 nm |
|---|---|---|---|---|---|---|---|---|---|---|
| | A | | | B | | | | | | |
| | La | Gd | Y | Zr | Sn | Hf | Sc | Bi | | |
| 35 | 1 | | | 0.999 | | | | 0.001 | 650 | 74.3 |
| 36 | 1 | | | 0.989 | | | 0.01 | 0.001 | 560 | 73.5 |
| 37 | | 1 | | 0.999 | | | | 0.001 | 520 | 62.4 |
| 38 | | 1 | | 0.989 | | | 0.01 | 0.001 | 520 | 60.8 |
| 39 | | | 1 | 0.999 | | | | 0.001 | 530 | 65.2 |
| 40 | | | 1 | 0.989 | | | 0.01 | 0.001 | 530 | 63.9 |

TABLE 8

| Comp. No. | Feed composition ratio (molar ratio) | | | | | | | | Light-emitting peak wavelength (nm) * During irradiation at 365 nm | Linear transmittance (%) @700 nm |
|---|---|---|---|---|---|---|---|---|---|---|
| | A | | | B | | | | | | |
| | La | Gd | Y | Zr | Sn | Hf | Sc | Bi | | |
| 41 | 0.5 | 0.5 | | 0.999 | | | | 0.001 | 630 | 69.7 |
| 42 | 0.5 | 0.5 | | 0.989 | | | 0.01 | 0.001 | 565 | 70.3 |
| 43 | 0.5 | 0.1 | 0.4 | 0.999 | | | | 0.001 | 620 | 71.1 |
| 44 | 0.5 | 0.1 | 0.4 | 0.989 | | | 0.01 | 0.001 | 560 | 70.5 |
| 45 | 0.1 | 0.9 | | 0.999 | | | | 0.001 | 520 | 68.4 |
| 46 | 0.1 | 0.9 | | 0.989 | | | 0.01 | 0.001 | 520 | 67.7 |
| 47 | 0.1 | 0.5 | 0.4 | 0.999 | | | | 0.001 | 525 | 65.9 |
| 48 | 0.1 | 0.5 | 0.4 | 0.989 | | | 0.01 | 0.001 | 520 | 68.0 |

As is apparent from the results of composition Nos. 35 and 36 in Table 7, the wavelength is shifted when the main element of the B site is Zr and when the main element of the A site is La. On the other hand, the wavelength is not shifted when the main element of the B site is Zr and when the main element of the A site is Gd or Y.

As is apparent from the evaluation results of composition Nos. 41 to 48 in Table 8, it is found that when the B site is Zr and the content ratio of La as the main element of the A site is 50 mol % or more, the wavelength is shifted.

It is to be noted that the light-emitting peak wavelength in composition No. 47 is different by 5 nm from that in composition No. 48. However, the difference of 5 nm of the light-emitting peak wavelength is considered to be in the measurement error range.

TABLE 9

| Comp. No. | Feed composition ratio (molar ratio) | | | | | | | | Light-emitting peak wavelength (nm) * During irradiation at 365 nm | Linear transmittance (%) @700 nm |
|---|---|---|---|---|---|---|---|---|---|---|
| | A | | | B | | | | | | |
| | La | Gd | Y | Zr | Sn | Hf | Sc | Bi | | |
| 49 | 0.5 | 0.25 | 0.25 | 0.999 | | | | 0.001 | 640 | 62.3 |
| 50 | 0.5 | 0.25 | 0.25 | 0.989 | | | 0.01 | 0.001 | 560 | 64.4 |
| 51 | 0.1 | 0.45 | 0.45 | 0.999 | | | | 0.001 | 510 | 60.8 |
| 52 | 0.1 | 0.45 | 0.45 | 0.989 | | | 0.01 | 0.001 | 510 | 61.6 |

TABLE 10

| Comp. No. | Feed composition ratio (molar ratio) | | | | | | | | Light-emitting peak wavelength (nm) * During irradiation at 365 nm | Linear transmittance (%) @700 nm |
|---|---|---|---|---|---|---|---|---|---|---|
| | A | | | B | | | | | | |
| | La | Gd | Y | Zr | Sn | Hf | Sc | Bi | | |
| 53 | 1 | | | 0.5 | | 0.499 | | 0.001 | 640 | 71.3 |
| 54 | 1 | | | 0.5 | | 0.489 | 0.01 | 0.001 | 560 | 70.0 |
| 55 | 0.5 | 0.25 | 0.25 | 0.5 | | 0.499 | | 0.001 | 630 | 69.5 |
| 56 | 0.5 | 0.25 | 0.25 | 0.5 | | 0.489 | 0.01 | 0.001 | 565 | 67.1 |
| 57 | 0.1 | 0.45 | 0.45 | 0.5 | | 0.499 | | 0.001 | 520 | 63.3 |
| 58 | 0.1 | 0.45 | 0.45 | 0.5 | | 0.489 | 0.01 | 0.001 | 520 | 66.4 |

TABLE 11

| Comp. No. | Feed composition ratio (molar ratio) | | | | | | | | Light-emitting peak wavelength (nm) * During irradiation at 365 nm | Linear transmittance (%) @700 nm |
|---|---|---|---|---|---|---|---|---|---|---|
| | A | | | B | | | | | | |
| | La | Gd | Y | Zr | Sn | Hf | Sc | Bi | | |
| 59 | 0.5 | 0.25 | 0.25 | 0.399 | 0.4 | 0.2 | | 0.001 | 620 | 61.8 |
| 60 | 0.5 | 0.25 | 0.25 | 0.389 | 0.4 | 0.2 | 0.01 | 0.001 | 560 | 60.3 |
| 61 | 0.1 | 0.45 | 0.45 | 0.399 | 0.4 | 0.2 | | 0.001 | 620 | 59.5 |
| 62 | 0.1 | 0.45 | 0.45 | 0.389 | 0.4 | 0.2 | 0.01 | 0.001 | 560 | 60.1 |

As is apparent from Table 9, when the main element of the B site is Hf and the content ratio of La as the main element of the A site is 50 mol % or more, the wavelength is shifted.

As is apparent from Table 10, it is found that when the main elements of the B site are Zr and Hf and the content ratio of La as the main element of the A site is 50 mol % or more, the wavelength is shifted.

As is apparent from Table 11, it is found that when the B site contains Sn, the wavelength is shifted even if the content of La as the main element of the A site is not 50 mol % or more.

Therefore, as is apparent from Tables 9 to 11, it is found that when the B site does not contain Sn but contains either Zr or Hf, and the content of La as the main element of the A site is 50 mol % or more, the wavelength shift effect can be obtained.

Although the cause of wavelength shift due to the addition of the above various elements is not certain, it is considered as follows.

A change of the light-emitting peak wavelength is observed irrespective of the type of the added element, and accordingly, the wavelength may be influenced by the relationship between the valence of the added ion and the substituted site. That is, it is considered that the wavelength may be influenced by the substitution of divalent ions for the A site where trivalent ions are usually located, and the substitution of trivalent ions for the B site where the tetravalent ions are usually located. Therefore, the site of the added element in the actual evaluation sample was examined. The evaluation samples of composition Nos. 3 and 11 were taken as examples, and the samples were speculated based on the lattice constants.

First, samples were produced by substituting Zr in the B site for 0, 5, 10, 20, 50, 90, and 100 mol % of Sn using LaZrOw as a base, and the measured values of the lattice constants were plotted against the average value of ionic radii of the B site constituting ions.

Figure 2:
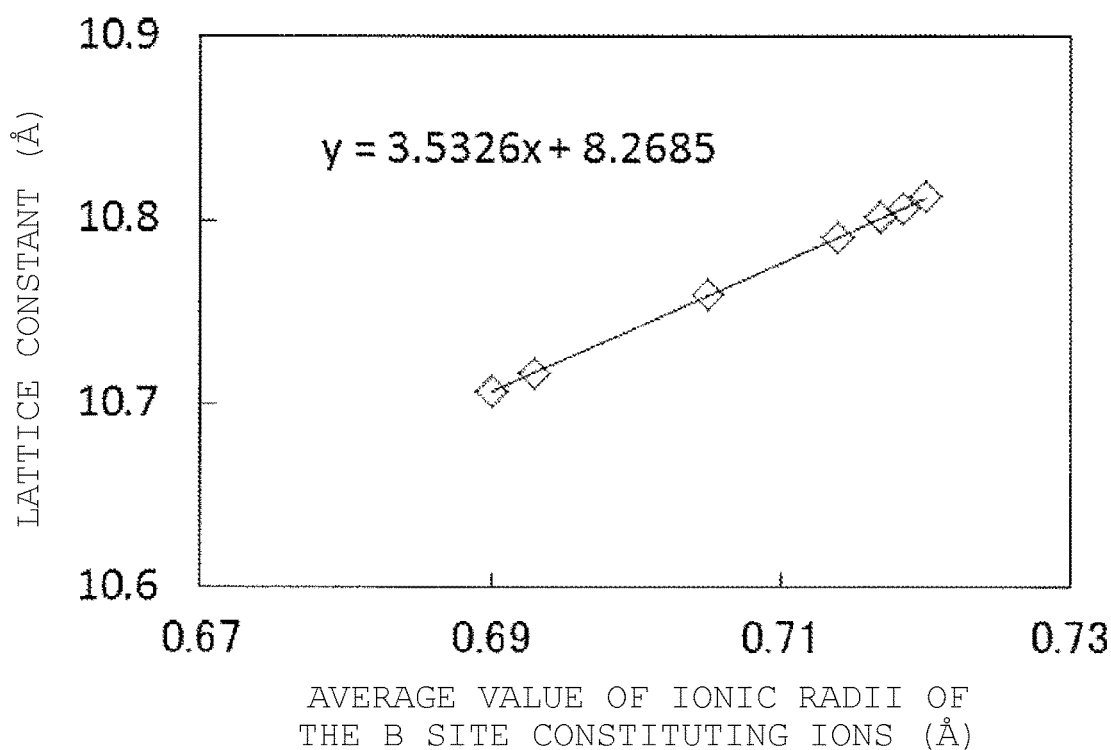
FIG. 2 is a diagram showing a relationship between an average value of radii of B site constituting ions and a lattice constant.
Figure 3:
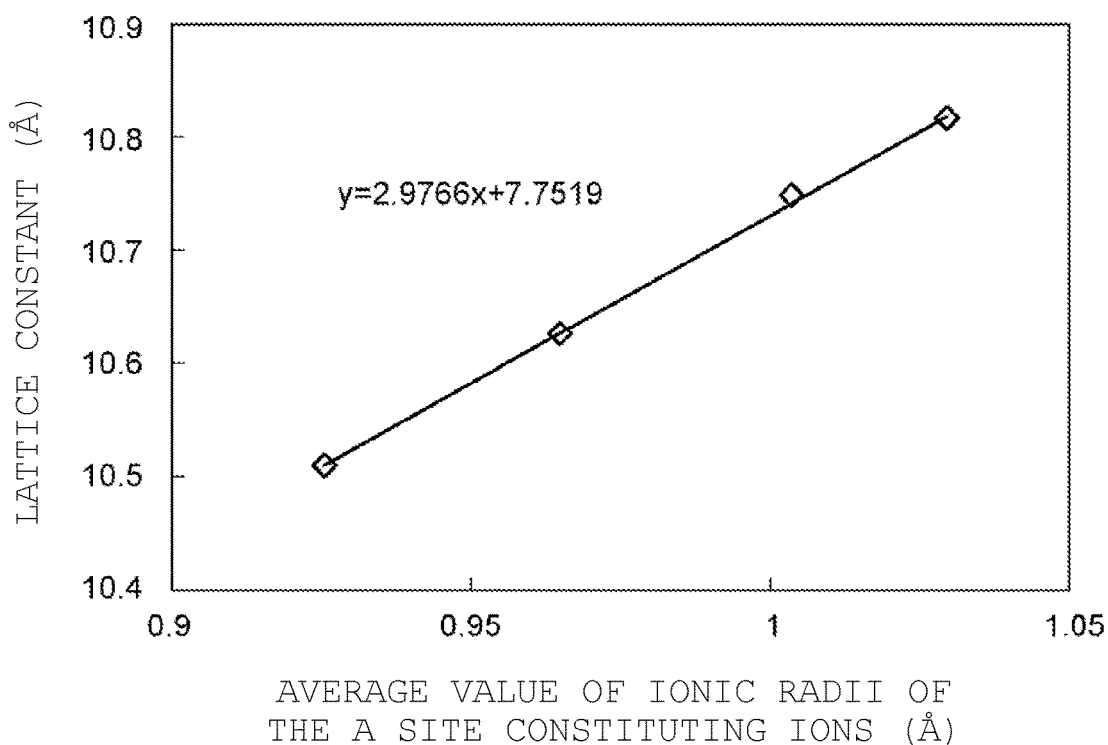
FIG. 3 is a diagram showing a relationship between an average value of radii of A site constituting ions and a lattice constant.

The results are shown in FIG. 2. Further, samples were similarly produced by substituting La in the A site for 0, 20, 50, and 80 mol % of Y, and the measured values of the lattice constants were plotted against the average value of ionic radii of the A site constituting ions. The results are shown in FIG. 3. Here, the average value of the ionic radii was obtained by a method of multiplying the six-coordinate ionic radius of each ion by the constituent ratio of the ion. As the ionic radii, the following Shannon values were obtained.

The six-coordinate ion radii of "Zr4+, Sn4+, La3+, Y3+, Ca2+, Lu3+"="0.72, 0.69, 1.032, 0.90, 1.00, 0.86"

From FIGS. 2 and 3, it is found that the average value of the ionic radii and the lattice constants are in an approximately linear relationship at both the B site and the A site, and conform to the Vegard's law. The linear approximation relation obtained here is used so that it is possible to calculate the increase/decrease amount of the lattice constant when the added substance is substituted for an element at a specific site.

Regarding the case of Ca in the evaluation sample of composition No. 3 and the case of Lu in the evaluation sample of composition No. 11, an estimated value of the increase/decrease amount of the lattice constant when 1 mol % of Ca or Lu was substituted for the A site or the B site was compared with the value actually determined by the XRD spectrum. The results are shown in Table 12 below.

TABLE 12

| Composition No. | Added element | | Increase and decrease of the lattice constant |
|---|---|---|---|
| 3 | Ca | When substituting the whole for the A site | −0.001 |
| | | When substituting the whole for the B site | 0.011 |
| | | Measured value (XRD) | −0.004 |
| 11 | Lu | When substituting the whole for the A site | −0.005 |
| | | When substituting the whole for the B site | 0.006 |
| | | Measured value (XRD) | −0.001 |

Although no exact agreement is found, as seen from Table 12, it is estimated that, in composition No. 3 of the evaluation sample in which a decrease in lattice constant is observed, Ca is substituted for the A site, meanwhile, in composition No. 11 of the evaluation sample in which almost no change in lattice constant is observed, Lu is substituted for both the A site and the B site. Therefore, the substitution of divalent ions for the A site and the substitution of trivalent ions for the B site are considered to be factors of changes in the light-emitting peak wavelength.

It is to be noted that, in Examples 1 to 4 described above, evaluation samples of composition Nos. 1 to 62 were provided, and the ratio of each of the elements in composition Nos. 1 to 62 is a molar ratio in the feed composition ratio. The molar ratio of the feed composition ratio is equivalent to the molar ratio as the content ratio of each element in the evaluation sample made of the actually obtained sintered body. This is confirmed based on the content ratio of the obtained sintered body, as determined by XRF analysis. Table 13 below shows the results obtained by XRF analysis of the content ratio of each of the elements in the evaluation samples which are sintered bodies obtained from composition Nos. 3 and 11.

TABLE 13

| La | Ca | Sn | Lu | Bi |
|---|---|---|---|---|
| 0.991 | 0.009 | 0.999 | 0 | 0.001 |
| 0.998 | 0 | 0.993 | 0.009 | 0.001 |

It is found that the feed composition ratio of each of the elements in composition No. 3 in Table 1 and composition No. 11 in Table 2 is equal to the molar ratio obtained by XRF analysis of each of the elements in Table 13.

Example 5

The evaluation sample of composition No. 1 described above and the evaluation sample of composition No. 63 shown in Table 14 below were obtained in the same manner as in Example 1. Further, the light-emitting peak wavelengths of the evaluation samples of composition Nos. 1 and 63 were obtained in the same manner as in Example 1. Further, the lattice constants were measured. The results are also shown in Table 14 below.

TABLE 14

| Comp. No. | Feed composition ratio (molar ratio) | | | | | Light-emitting peak wavelength (nm) * During irradiation at 365 nm | lattice constant |
|---|---|---|---|---|---|---|---|
| | A | | B | | | | |
| | La | Y | Zr | Sn | Bi | | |
| 63 | 1 | | 0.099 | 0.9 | 0.001 | 700 | 10.717 |
| 1 | 1 | | | 0.999 | 0.001 | 700 | 10.706 |

As is apparent from Table 14, no shift occurred in the light-emitting peak wavelength of each of the evaluation samples of composition Nos. 1 and 63.

Example 6

Evaluation samples of composition Nos. 35, 36, and 64 to 71 shown in Table 15 below were obtained in the same manner as in Example 1. The light-emitting peak wavelength and the linear transmittance of each of the evaluation samples were determined in the same manner as in Example 1. Regarding the evaluation sample of composition No. 35, the lattice constant is also shown.

TABLE 15

| Comp. No. | Feed composition ratio | | | | Light-emitting peak wavelength (nm) * During irradiation at 365 nm | Linear transmittance (%) @700 nm | lattice constant (Å) |
|---|---|---|---|---|---|---|---|
| | A | B | | | | | |
| | La | Zr | Sc | Bi | | | |
| 35 | 1 | 0.999 | | 0.001 | 650 | 74.3 | 10.813 |
| 36 | 1 | 0.989 | 0.01 | 0.001 | 560 | 73.5 | — |
| 64 | 1 | 0.9985 | 0.0005 | 0.001 | 650 | 73.5 | — |
| 65 | 1 | 0.998 | 0.001 | 0.001 | 605 | 73.2 | — |
| 66 | 1 | 0.997 | 0.002 | 0.001 | 565 | 72.9 | — |
| 67 | 1 | 0.979 | 0.02 | 0.001 | 560 | 72.6 | — |
| 68 | 1 | 0.899 | 0.1 | 0.001 | 560 | 64.1 | — |
| 69 | 1 | 0.799 | 0.2 | 0.001 | 560 | 49.3 | — |
| 70 | 1 | 0.9994 | 0.0005 | 0.0001 | 560 | 73.4 | — |
| 71 | 1 | 0.999 | 0.0005 | 0.0005 | 620 | 72.8 | — |

The comparison between composition No. 35 and composition No. 36 shows that even if Sc is contained therein, the light-emitting peak wavelength is shifted and sufficient linear transmittance can be obtained. Further, the results of composition Nos. 64 to 69 show that, in the case of the co-addition of Sc similarly to the case of Ca, when the content ratio of Sc is 0.1 mol % or more, the wavelength is sufficiently shifted. On the other hand, it is confirmed that when the content ratio is greater than 20 mol %, the linear transmittance is lower than that of the evaluation sample of composition No. 69. Further, as is apparent from the evaluation samples of composition Nos. 70 and 71, it is found that in the case of the co-addition of Sc, the shift amount of the light-emitting peak wavelength changes when the content ratio of Bi changes.

It is to be noted that, in the light-emitting ceramic according to the present invention, in the light-emitting ceramic made of a pyrochlore type compound represented by $ABO_W$, which is finally obtained by preparation, each of the elements is present at the A site or the B site. It is possible to confirm at which site each of the elements is present among the A site or the B site by, for example, X-ray absorption fine structure (XAFS) using radiation light. The XAFS can obtain information on the site where the element is present and is often used for qualitative analysis, and further it is possible to quantify the occupancy of the element by XAFS analysis.

That is, in the X-ray region, each of the elements has an absorption inherent to the element associated with the inner shell transition. From this absorption spectrum, information such as the type, number, bonding distance, and symmetry of atoms coordinated to the target element is obtained. From the information on the element known to be present at a predetermined site in the material and the measurement result of XAFS, it is possible to know at which site each of the elements is present.

DESCRIPTION OF REFERENCE SYMBOLS

1: Wavelength converter
2: Light source
3: Reflector
4: Substrate
6: Wavelength conversion device

The invention claimed is:

1. A light-emitting ceramic comprising:
a pyrochlore type compound that contains 0.01 mol % or more of Bi with respect to 100 mol % of $ABO_W$; and
at least one co-added element selected from the group consisting of Mg, Ca, Zn, Sr, Ba, Sc, Ga, In, Yb, and Lu,
wherein A contains at least one first element selected from the group consisting of La, Y, and Gd in a total amount of 80 mol % or more,
B contains at least Sn, and
W is a positive number for maintaining electrical neutrality.

2. The light-emitting ceramic according to claim 1, wherein B further contains at least one of Zr and/or Hf.

3. The light-emitting ceramic according to claim 1, wherein a total content of the at least one co-added element is 0.1 mol % or more.

4. The light-emitting ceramic according to claim 1, wherein a content of the at least one co-added element is not less than a content of the Bi.

5. The light-emitting ceramic according to claim 1, wherein a content of the at least one co-added element is less than 20 mol %.

6. The light-emitting ceramic according to claim 1, wherein a content of the at least one co-added element is 10 mol % or less.

7. The light-emitting ceramic according to claim 1, wherein A contains any of Mg, Ca, Zn, Sr, and Ba.

8. The light-emitting ceramic according to claim 1, wherein B contains any of Sc, Ga, In, Yb, and Lu.

9. The light-emitting ceramic according to claim 1, wherein the light-emitting ceramic has a light-emitting peak wavelength in a visible region when irradiated with ultraviolet rays that differs by 10 nm or more from a light-emitting peak wavelength of a light-emitting ceramic that does not contain any of the at least one co-added element selected from the group consisting of Mg, Ca, Zn, Sr, Ba, Sc, Ga, In, Yb, and Lu.

10. A wavelength conversion device comprising:
the light-emitting ceramic according to claim 1; and
a light source that irradiates the light-emitting ceramic with ultraviolet rays.

11. A light-emitting ceramic comprising:
a pyrochlore type compound that contains 0.01 mol % or more of Bi with respect to 100 mol % of $ABO_W$; and
at least one co-added element selected from the group consisting of Mg, Ca, Zn, Sr, Ba, Sc, Ga, In, Yb, and Lu,
wherein A contains at least one selected from the group consisting of La, Y, and Gd, a total amount of the La, Y, and Gd is 80 mol % or more, and a total amount of the La is at least 50 mol % or more,
B contains at least Zr or Hf, and
W is a positive number for maintaining electrical neutrality.

12. The light-emitting ceramic according to claim 11, wherein B further contains Sn.

13. The light-emitting ceramic according to claim 11, wherein a total content of the at least one co-added element is 0.1 mol % or more.

14. The light-emitting ceramic according to claim 11, wherein a content of the at least one co-added element is not less than a content of Bi.

15. The light-emitting ceramic according to claim 11, wherein a content of the at least one co-added element is less than 20 mol %.

16. The light-emitting ceramic according to claim 11, wherein a content of the at least one co-added element is 10 mol % or less.

17. The light-emitting ceramic according to claim 11, wherein A contains any of Mg, Ca, Zn, Sr, and Ba.

18. The light-emitting ceramic according to claim 11, wherein B contains any of Sc, Ga, In, Yb, and Lu.

19. The light-emitting ceramic according to claim 11, wherein the light-emitting ceramic has a light-emitting peak wavelength in a visible region when irradiated with ultraviolet rays that differs by 10 nm or more from a light-emitting peak wavelength of a light-emitting ceramic that does not contain any of the at least one co-added element selected from the group consisting of Mg, Ca, Zn, Sr, Ba, Sc, Ga, In, Yb, and Lu.

20. A wavelength conversion device comprising:
the light-emitting ceramic according to claim 11; and
a light source that irradiates the light-emitting ceramic with ultraviolet rays.

* * * * *